United States Patent [19]

Fassbender

[11] 4,106,109

[45] Aug. 8, 1978

[54] RANDOM ACCESS MEMORY SYSTEM PROVIDING HIGH-SPEED DIGITAL DATA OUTPUT

[75] Inventor: Charles J. Fassbender, Plano, Tex.

[73] Assignee: NCR Corporation, Dayton, Ohio

[21] Appl. No.: 764,603

[22] Filed: Feb. 1, 1977

[51] Int. Cl.² .......................... G11C 8/02; G11C 7/00
[52] U.S. Cl. .................................... 365/238; 365/221
[58] Field of Search ........ 340/173 R, 174 A, 174 NC;
364/900 MS file, 200 MS File; 365/219, 221, 231, 238, 230

[56] References Cited

U.S. PATENT DOCUMENTS

| | | | |
|---|---|---|---|
| 3,317,902 | 5/1967 | Michael | 340/174 NC |
| 3,641,519 | 2/1972 | Ashley | 340/174 NC |
| 3,691,538 | 4/1972 | Haney et al. | 365/219 X |
| 3,898,632 | 8/1975 | Spencer, Jr. | 340/173 R |
| 3,992,703 | 11/1976 | Luisi et al. | 340/173 R |
| 4,023,144 | 5/1977 | Koenig | 364/900 |

Primary Examiner—Bernard Konick
Assistant Examiner—Donald McElheny
Attorney, Agent, or Firm—J. T. Cavender; Edward Dugas

[57] ABSTRACT

The disclosed random access memory (RAM) for digital data includes the normal data input circuit, a memory matrix for storing applied data, address control circuits for selectively addressing any cell of the memory matrix, and a data output circuit for selectively applying digital data stored in the memory matrix to a data output line. To achieve a high digital data output rate, a rate substantially higher than the rate at which the cells of the memory can be addressed, the improved RAM includes a data output register having a multiplicity of data storage elements and means for simultaneously reading digital data stored in the memory matrix in parallel into the data storage elements of the output register. This data then is selectively applied to the data output line while new data is being addressed in the memory matrix. Thus, data may be accessed in the memory matrix of the RAM at the normal, relatively slow rate while data previously loaded into the output register is read to the data output line at a relatively high rate.

6 Claims, 3 Drawing Figures

RANDOM ACCESS MEMORY SYSTEM PROVIDING HIGH-SPEED DIGITAL DATA OUTPUT

BACKGROUND OF THE INVENTION

This invention concerns a random access memory for digital data, particularly a memory having a data output rate substantially higher than the rate at which data can be accessed in the memory.

Random access memories (RAMs) have been used for years in digital systems to store digital data. Conventionally, RAMs consist of not only memory circuitry but also input and output circuitry all on a single chip of semiconductor material which is contained in a single integrated circuit packaged on a 16 pin base. As their technology has progressed, a variety of different RAMs have been developed including those with provisions for non-destructive reading of stored digital information, those in which the stored digital information is non-volatile and need not be refreshed periodically, those incorporating their own internal address decoding circuits, those incorporating relatively high-speed bipolar logic elements, and those incorporating relatively slower, metal oxide semiconductor (MOS) elements. While such MOS RAMs are much cheaper than bipolar RAMs, because they require significantly longer times to access stored data, their use is becoming more and more limited as digital systems improve to the point where memory access time determines their operating speed.

Accordingly, a major object of this invention is to provide a high-speed data output system for a low-speed random access memory, particularly a MOS RAM. Other objects of this invention will be apparent to those skilled in the art from the following detailed description of a preferred embodiment.

SUMMARY OF THE INVENTION

In the preferred embodiment of the random access memory of the present invention there is provided a data input line along with a memory matrix for storing digital data at addressable locations. A first address means is provided for addressing a selected location of the memory matrix so as to direct data from the data input line to the selected location in the memory matrix. A second address means addresses the memory matrix to access the data stored at a plurality of selected locations in the memory matrix. An output register is operatively connected to the memory matrix for simultaneously receiving and for addressably storing the data addressed by the second address means. An output multiplexer is operatively connected to the output register and is responsive to the first address means so as to operatively connect a data output terminal to an addressed storage location of the output register in response to the address directed to the multiplexer by the first address means. The improvement in this random access memory (RAM), is particularly in its data output circuit, which comprises the output register including a multiplicity of electrical charge data storage elements, means for simultaneously reading electrical charge data stored in portions of the memory matrix in parallel into the multiplicity of data storage elements of the output register, and means for selectively applying the electrical charge data stored in the output register to the data output line. Preferably, new data is addressed in the memory matrix while the data previously read into the output register is selectively applied to the data output line so that when the output register is ready to receive a new set of data, the new data is already addressed in the matrix and ready for presentation to the output register, the output register then loading such new data in response to a control signal, such as a clock signal. Preferably the coded address information applied to the RAM includes both high-order address information for designating a multiplicity of data storage locations in the memory matrix, and low-order address information for designating either one of the multiplicity of data storage locations in the memory matrix or one of the data storage elements of the output register. Thus, when writing information into the memory, both the high-order and low-order addresses are employed to designate a particular data location in the memory matrix, while when reading information stored in the memory, the high-order address information is applied over the extended interval required to address that information in the memory matrix while the low-order address information is applied to the output to address information stored in it at a relatively high rate. This circuitry preferably is all contained in a single, multi-pin integrated circuit package.

BRIEF DESCRIPTION OF THE DRAWINGS

The invention will be further described in connection with the accompanying drawings in which.

DETAILED DESCRIPTION OF THE INVENTION

Many different technologies have been developed for random access memories. While the preferred embodiment of the RAM described herein employs one specific architecture, an architecture significantly related to the MOS components described, it should be clearly understood, as will be obvious to those skilled in this art, that a variety of different system architectures could be employed and would be employed if different technologies were to be used. Accordingly, the following description should be considered merely to be exemplary of the principles of this invention.

Today the conventional RAM incorporates on one memory chip contained within a conventional 16-pin integrated circuit package a memory matrix, decoding circuits for addressing a particular cell of the memory matrix, a data input line, and a read/write control line among other things. Such memories are well known and in wide use. Among the least expensive of such memories is the MOS type of RAM. Unfortunately, MOS memories require considerably greater times to access data stored in them. This is due to the fact that the entire memory matrix is cycled each time a bit of information is read from the RAM. This information is stored in the RAM as a small charge, whose presence or absence requires a long time to detect. Since digital systems today often are limited in their operational speed by the time required to access data in memory, the use of MOS RAMs is becoming ever more limited, even though they offer significant economies over other types of RAMs. As will be apparent from the following description, a RAM architecture is presented by this invention which permits digital data to be supplied by the RAM at a rate considerably greater than the rate at which the data can be accessed by prior RAM architectures.

Figure 1:
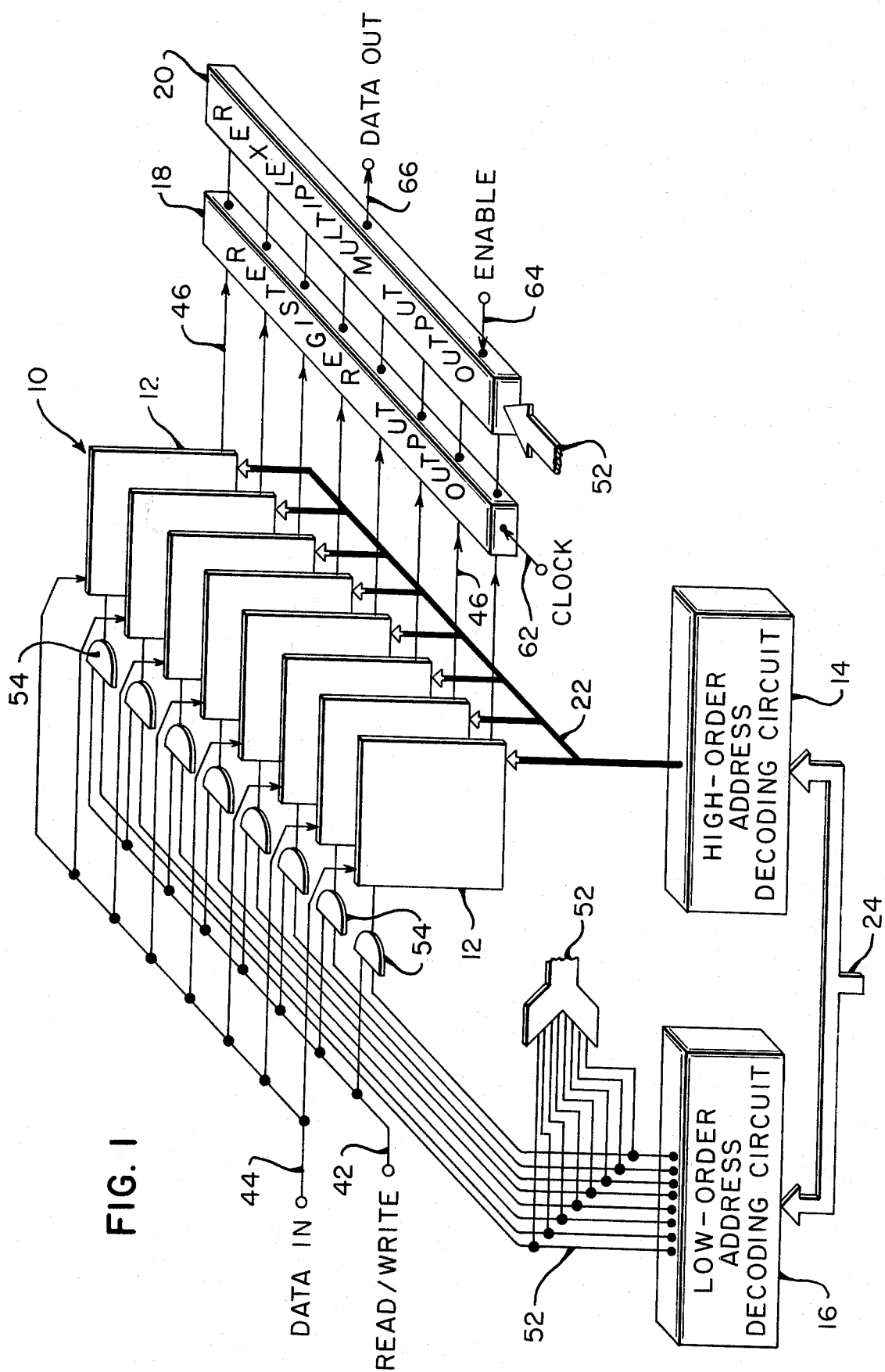
FIG. 1 is a schematic diagram illustrating the interrelationship of the various elements of a preferred RAM.

For clarity of illustration, a preferred RAM architecture is presented in FIG. 1 in a schematic, three-dimensional fashion. It would, of course, all be laid out on a single semiconductor chip in the preferred form, a procedure well within the ability of those skilled in RAM production. The RAM includes a memory matrix 10 having a plurality of simultaneously addressable portions 12. This memory matrix may be fabricated of metal oxide semiconductor (MOS) elements in a conventional fashion. For example, the cells within matrix 10 may be of the one-transistor, single-level polysilicon or double-level polysilicon type. Also included in the RAM are address decodings circuits, specifically a high-order address decoding circuit 14 and a low-order address decoding circuit 16. These are of conventional construction and well known to RAM designers. The other major system components of the RAM include an output register 18 and an output multiplexer 20. The register is triggerable and may be a "latch" or "D" type. Each portion 12 of the memory matrix has an output lead which couples it to the register 18. Register 18 serves as a temporary buffer from which information is read at a fast rate while, at the same time, the portions 12 are read at a slower rate. For purposes of illustration, the memory matrix has been divided into eight portions, and the output register then includes eight data storage elements. However, it should be clearly understood that the memory matrix may be divided into a greater or lesser number of portions and a correspondingly greater or lesser number of data storage elements may be provided in the output register.

Figure 2:
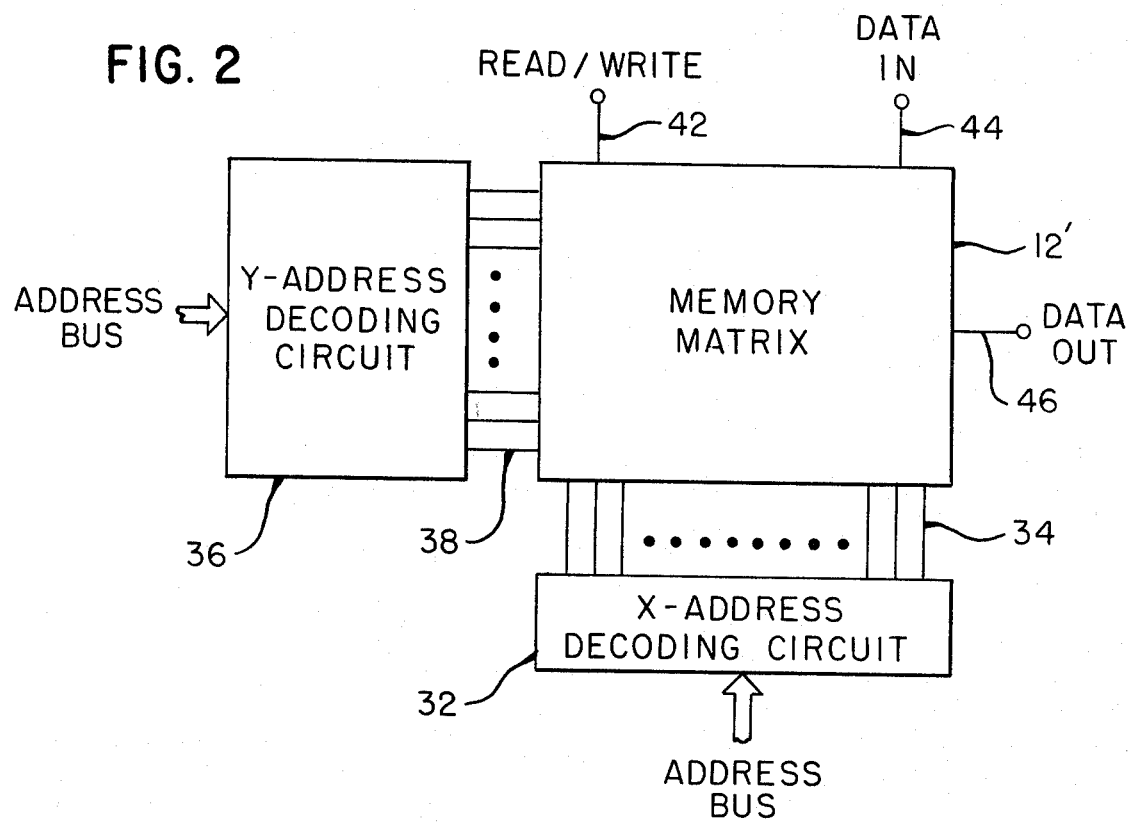
FIG. 2 is a schematic diagram of one portion of the memory matrix employed in a preferred RAM.

All portions of the memory matrix are simultaneously addressed by the high-order address decoding circuit 14 over an address bus 22. Assuming for example that the memory matrix incorporates 4,096 memory cells, each portion 12 then will include 512 cells. To address one of these cells in each portion of the memory matrix, a 9-bit binary coded address signal (for example address signals A3 through A11) are applied to the high-order address decoding circuit 14 over lines 24. As shown in FIG. 2, this binary coded address information includes both X and Y axis information for the matrix, five bits (for example) of the address information being decoded by an X-address decoder circuit 32 to actuate one of 32 X-address lines 34 of the memory matrix portion 12'. The other four bits of the binary coded address are applied to a Y-address decoded circuit 36 and decoded by it to energize one of 16 Y-address lines 38 of the memory matrix portion 12'. The intersection of the particular, energized X and Y address lines determines the selected cell of the memory matrix portion 12'. A read/write control signal on lines 42 is applied to the memory matrix and determines, in a conventional fashion, whether data on a data input line 44 applied also to all cells of the memory matrix is written into a selected cell, or whether the data in that cell is applied to a data output line 46.

Since this high-order address information is applied over the address bus 22 to all portions of the memory matrix, a discrete cell (identical in location) is addressed in each of the eight portions 12 of the memory matrix. To write data into one of these locations, a write signal is applied to a read/write control line 42. This signal, together with the low-order address control information applied to the low-order address decoding circuit 16 over address lines 24, causes data to be written into one portion 12 of the memory matrix 10. More specifically, the low-order address decoding circuit 16 decodes the three bits (for example) of low-order address information to energize one of the eight low-order address lines 52. Each of these address lines is connected to a selected one of the eight portions of the memory matrix through an AND gate 54. The particular low-order address line designated by the low-order address applied to decoder circuit 16 produces, together with the read/write signal applied on line 42, a coincidence in one of AND circuits 54 to thereby write the applied digital information into the discrete cell in that particular memory portion designated by the combined actions of the high and low-order address information as just described. In this fashion, information may be written into each cell of the memory matrix.

To read information from the memory matrix, high-order address information is applied to the high order decoding circuit 14 in a conventional fashion, which in turn addresses a cell of each memory matrix portion 12. The information stored in each of these cells is then detected by sense amplifiers contained in each matrix portion and, in response, full logic signals are generated on the associated data output lines 46 and applied to the output register 18. This detection of information in a memory cell requires the usual RAM access time. That is, it is relatively slow process—typically about 400 nanoseconds. The reason is that the information is stored in the memory cells as a small charge which requires appreciable time to detect. Upon occurrence of a control signal, such as a clock signal applied on line 62 to the output register, the full level digital logic signals presented on memory matrix output lines 46 are loaded simultaneously (i.e., in parallel) into the eight data storage elements of the output register. Each of these data storage elements at the output register are connected to the output multiplexer 20. Also applied to the output multiplexer are the low-order address lines 52, the energized address line determining the particular data storage element of the output register selected by the multiplexer. Upon occurrence of a control signal, such as an enable signal on line 64 applied to the output multiplexer, the data storage element designated by the energized low-order address line 52 is connected to a data output circuit on line 66 causing the logic information now held in that data storage element to be applied to the output circuit as a digital output of the RAM.

By this arrangement, logic information in the output register may be selectively accessed at a relatively high rate while simultaneously a new set of cells in the memory matrix is being addressed at a relatively slow rate. The access time of the memory matrix is relatively slow because memory arrays are designed primarily to maximize the number of memory cells per unit of chip surface area. This necessarily makes the cell size small, and hence the charge stored in the cell also is small. Therefore, detection of the small charge in an addressed cell requires difference amplifiers and clock generators, and the operation of this circuitry gives rise to a large read time. Conversely, the access time of the output register is relatively fast because it involves only full logic signals, and also less logic elements. As a specific example, a typical MOS RAM memory matrix may require some 400 nanoseconds (ns) for the small charges stored in the memory cells to be detected by the sense amplifiers and valid data to be presented on the output lines 46 after the high-order address information has been presented to the high-order address decoding circuit 14. In comparison, data may be fed from the output register through the multiplexer to the data output line at a much higher rate, such as at a 40 ns rate. Thus, to most efficiently use this RAM system, upon clocking data into the output register the next high-order address is presented to the high-order address decoding circuit 14. The data now held in the output register is selectively cycled by the multiplexer to the data output line 64 under control of the low-order address decoding circuit, while the high-order address information simultaneously selects a new set of data from the memory matrix. After selectively cycling through the information held in the output register, the transients of the sense amplifiers have settled and the next set of information held in the memory matrix will be ready to be loaded into the output register under control of clock signal applied on line 62.

Clearly such a RAM architecture is highly useful when it is desired to rapidly sequence in a random fashion through selected blocks of data stored in a RAM. For example, a program of instructions may loop within such blocks of a 40 ns rate, and branch between blocks of a 400 ns rate. It is also useful in a number of other situations in which selected groups of digital information are required to be used, for example as a data buffer for an input/output (I/O) device.

While a specific system architecture has been described in which the memory matrix has been divided into eight portions and eight output registers have been provided, clearly when given the same number of memory cells a greater or lesser number of memory matrix portions and output registers may be employed if desired. For example, memory matrix 10 could contain 4096 cells divided into 64 discrete portions and 64 output registers connected to the memory matrix, one to each portion. Presently available MOS RAM memory matrixes contain 4096 cells arranged on 64 rows and 64 columns. Thus, each portion would be one row, and each row would couple to a flip-flop in the output register. The data stored in the output register then would be selectively addressed by the output multiplexer to the digital data output line. In this case, six low-order address bits would control the multiplexer.

Figure 3:
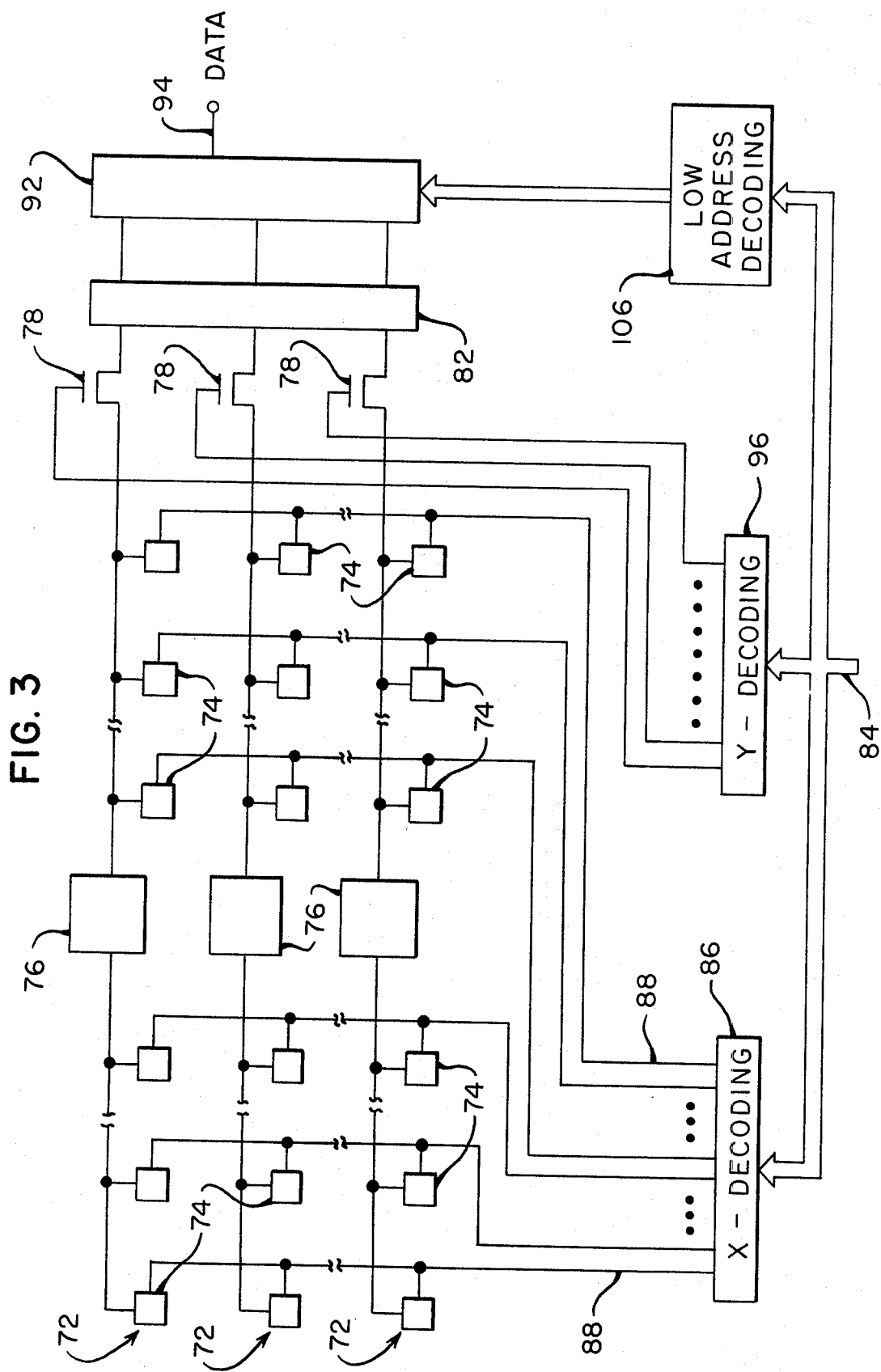
FIG. 3 is a schematic diagram illustration of a 4096 cell memory matrix having one output register flip-flop for each column line.

Such an architecture is illustrated in FIG. 3. It employs a square 64 by 64 cell memory matrix, each of the 64 rows 72 including 64 memory cells 74. All the cells of each row are connected through a differential sense amplifier 76 and a gate 78 to an output register 82, this register containing 64 data storage elements. To read information from the memory into the output register, X-address decoding information supplied over address bus 84 to the decoding circuit 86 energizes one of the 64 address lines 88 to simultaneously read the information in each of the 64 memory cells through its associated sense amplifier 76 and gate 78 into the associated data storage element of the output register. The resultant data set then may be read, bit by bit, through the output register 92 to a data output line 94 under control of low-order address decoding information applied to the output register by the low-order address decoder 106 as described in connection with FIG. 1. To write information into the memory, preferably a bidirectional data path is provided permitting the digital data to be applied over line 94 and through one of the gates 78 selected by the Y address decoding circuit 96 to the memory cell selected by the X address decoding circuit 86.

This memory, and the memory illustrated in FIGS. 1 and 2, both provide a low-speed memory having a high storage capacity and a high-speed memory having a low storage capacity. By combining these two memories in a single package, the need for a large number of external pins or connections is eliminated. For example, the memory output illustrated in FIG. 3 requires 64 lines, and thus at least 64 pins would be required were only it included in the package. Clearly this is not practical. The high-speed, low-storage capacity memory provided by the output register eliminates the need for a large number of output pins and results in a very practical memory, one which also provides a significant improvement in the average access time for stored data as has been noted.

It should also be noted that additional read access speed may be gained by constructing the low-order address decode logic and output multiplexer with high-speed logic components such as ECL or $T^2L$ components. This is possible to do and still integrate the device on a chip because the amount of logic is small, and thus the chip space required is small compared to the chip space required by the memory matrix.

Also, the invention can be used in conventional fashion—that is the matrix can be cycled once for each set of information accessed. If the output register is constructed as a latch then no clocks are needed. Thus, only one part is required to build conventional type memories or serial in parallel out (SIPORAM) type memories as herein described.

Other variations of the RAM will occur to those skilled in this art in view of the teachings set forth herein. Accordingly, the scope of the invention should not be limited to the specific embodiments that have been disclosed, but rather is defined by the following claims.

I claim:

1. A random access memory for digital data comprising:
   a data input line;
   a memory matrix for storing digital data at addressable locations;
   first address means for addressing a selected location of said memory matrix for directing data from said data input line to said selected location;
   second address means for addressing said memory matrix to access data stored at a plurality of selected locations in said memory matrix;
   output register means operatively connected to said memory matrix for simultaneously receiving and addressably storing the data addressed by said second address means; and
   an output multiplexer means responsive to said first address means and operatively connecting a data output terminal to an addressed storage location of said output register means in response to the address dictated by said first address means and an enabling signal.

2. The random access memory according to claim 1 wherein said first address means is comprised in part of:
   a READ/WRITE gate means interposed between said first address means and said memory matrix for operatively connecting said first address means to said memory matrix in response to a WRITE signal and for operatively disconnecting said first address means from said memory matrix in response to a READ signal.

3. The random access memory according to claim 1 wherein said output register means stores the data addressed by said second address means and a plurality of bits constituting a block of data at addressable locations.

4. The random access memory according to claim 3 and further comprising:

clocking means operatively connected to said output register means for simultaneously moving bits of data from said memory matrix within said output register means.

5. A random access memory as set forth in claim 1 in which said second address means for addressing a plurality of selected locations in said memory matrix may simultaneously address said selected locations while said first address means selects a storage location in said output register to be operatively connected to a data output terminal.

6. A random access memory as set forth in claim 5 including means for storing input data in discrete locations of said memory matrix, the number of discrete locations being at least equal to the number of addressable stored data elements in said output register means; and said second address means operative to simultaneously address, in parallel selected discrete locations in said memory matrix.

* * * * *

UNITED STATES PATENT AND TRADEMARK OFFICE
CERTIFICATE OF CORRECTION

PATENT NO. : 4,106,109

DATED : August 8, 1978

INVENTOR(S) : Charles J. Fassbender

It is certified that error appears in the above-identified patent and that said Letters Patent are hereby corrected as shown below:

Column 7,

Line 5, delete "and" and instead insert -- as --.

Signed and Sealed this

Twenty-seventh Day of February 1979

[SEAL]

Attest:

RUTH C. MASON
Attesting Officer

DONALD W. BANNER
Commissioner of Patents and Trademarks